United States Patent [19]
Vermette

[11] Patent Number: 6,148,506
[45] Date of Patent: Nov. 21, 2000

[54] INSERTION/EXTRACTION TOOL FOR PRINTED CIRCUIT BOARD

[75] Inventor: Louis Raymond Vermette, Brossard, Canada

[73] Assignee: Harris Corporation, Melbourne, Fla.

[21] Appl. No.: 09/109,594

[22] Filed: Jul. 2, 1998

[51] Int. Cl.[7] ............................................ B23P 19/00
[52] U.S. Cl. .................... 29/758; 29/729; 29/759; 361/725; 361/726; 361/752; 361/754; 361/759; 361/796; 361/801; 439/153; 439/327
[58] Field of Search .......................... 29/758, 759, 842, 29/729; 361/724, 725, 726, 727, 752, 754, 759, 796, 798, 801, 802; 439/152, 153, 154, 155, 156, 327

[56] References Cited

U.S. PATENT DOCUMENTS

| | | |
|---|---|---|
| 4,083,616 | 4/1978 | McNiece et al. . |
| 4,875,867 | 10/1989 | Hoo . |
| 4,996,631 | 2/1991 | Freehauf . |
| 5,030,108 | 7/1991 | Babow et al. . |
| 5,309,325 | 5/1994 | Dreher et al. . |
| 5,364,282 | 11/1994 | Tondreault ............................. 439/157 |
| 5,414,594 | 5/1995 | Hristake . |
| 5,506,758 | 4/1996 | Cromwell ................................ 361/798 |

*Primary Examiner*—Jessica J. Harrison
*Assistant Examiner*—Binh-An Nguyen
*Attorney, Agent, or Firm*—Rogers & Killeen

[57] ABSTRACT

The invention relates to an insertion/extraction tool for inserting and extracting printed circuit boards from a card cage. The invention uses fewer parts than the prior art and reduces bending stress on the printed circuit board by simultaneously applying the insertion or extraction force to both sides of the plane of the printed circuit board.

7 Claims, 6 Drawing Sheets

TOP VIEW
FULLY INSERTED

TOP VIEW
EXTRACTING

BOTTOM PORTION

TOP PORTION

INSERTION/EXTRACTION TOOL FOR PRINTED CIRCUIT BOARD

BACKGROUND OF THE INVENTION

The invention relates to an insertion/extraction tool for inserting and extracting a printed circuit board. Specifically, the invention comprises an improved insertion/extraction tool where fewer components are required than in the prior art, more space is available on the printed circuit board for electrical components since the handle of the tool is only on one side of the printed circuit board, and less wear and tear of the printed circuit board is achieved during insertion and extraction since the invention transmits the insertion and extraction force on both sides of the plane of the printed circuit board.

Accordingly, it is an object of the present invention to provide a novel insertion/extraction tool which requires fewer components than the prior art.

It is another object of the present invention to provide a novel insertion/extraction tool that minimizes bending stress on the printed circuit board due to the simultaneous transmission of force on both sides of the plane of the printed circuit board during insertion and extraction operations.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
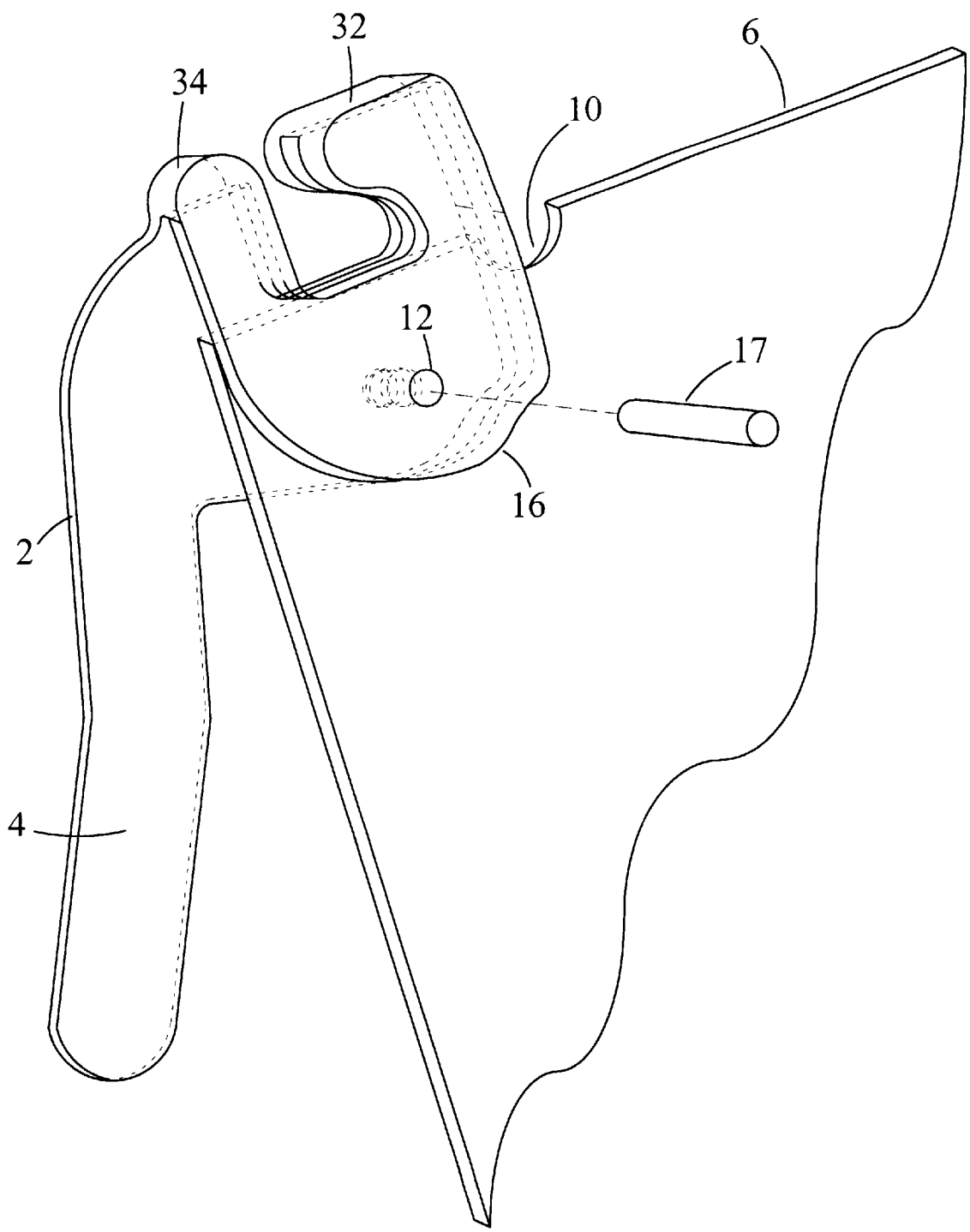
FIG. 1 is a perspective view of one preferred embodiment of the insertion/extraction tool with an exploded view of the pivot means.

Reference is now made to FIGS. 1 through 6, wherein like parts are designated with like numerals throughout. One preferred embodiment of the insertion/extraction tool is illustrated.

The insertion/extraction tool 2, in the preferred embodiment shown, has a handle 4 which is integrally connected to lower body portion 14. Lower toe portion 28 and lower heel portion 30 extend from lower body portion 14 to form an aperture for receiving the protruding portion of chassis 18. Lower hole 13 for receiving pivot means 17 is positioned substantially between lower toe portion 28 and lower heel portion 30. Handle 4, lower body portion 14, lower toe portion 28, and lower heel portion 30 are below the plane of printed circuit board 6.

The elongated portion of handle 4 closest to the lower body portion is oriented substantially parallel to the front edge of printed circuit board 6 when printed circuit board 6 is in the fully inserted position. The tail end of the elongated portion of handle 4 is angled out away from printed circuit board 6 to allow the operator of the insertion/extraction tool to more easily grip handle 4 during extraction of printed circuit board 6 from the fully inserted position.

Upper body portion 16 is positioned above the plane of printed circuit board 6 and directly above lower body portion 14. Upper toe portion 29 and upper heel portion 31 extend from upper body portion 16 to form an aperture for receiving the protruding portion of chassis 18. Upper hole 12 for receiving pivot means 17 is positioned substantially between upper toe portion 29 and upper heel portion 31.

Upper and lower toe portions 28 and 29, respectively, are integrally connected at sections 32 and 34, respectively so as to form a slot for receiving printed circuit board 6 between the upper and lower portions of the tool.

Hole 8 in printed circuit board 6 is positioned to receive pivot means 17. Holes 8, 12, and 13 align to receive pivot means 17. Pivot means 17 securely attaches printed circuit board 6 to insertion/extraction tool 2.

Notch 10 in printed circuit board 6 is positioned to allow space for toe section 32 during pivoting motion of the insertion/extraction tool 2.

Figure 2:
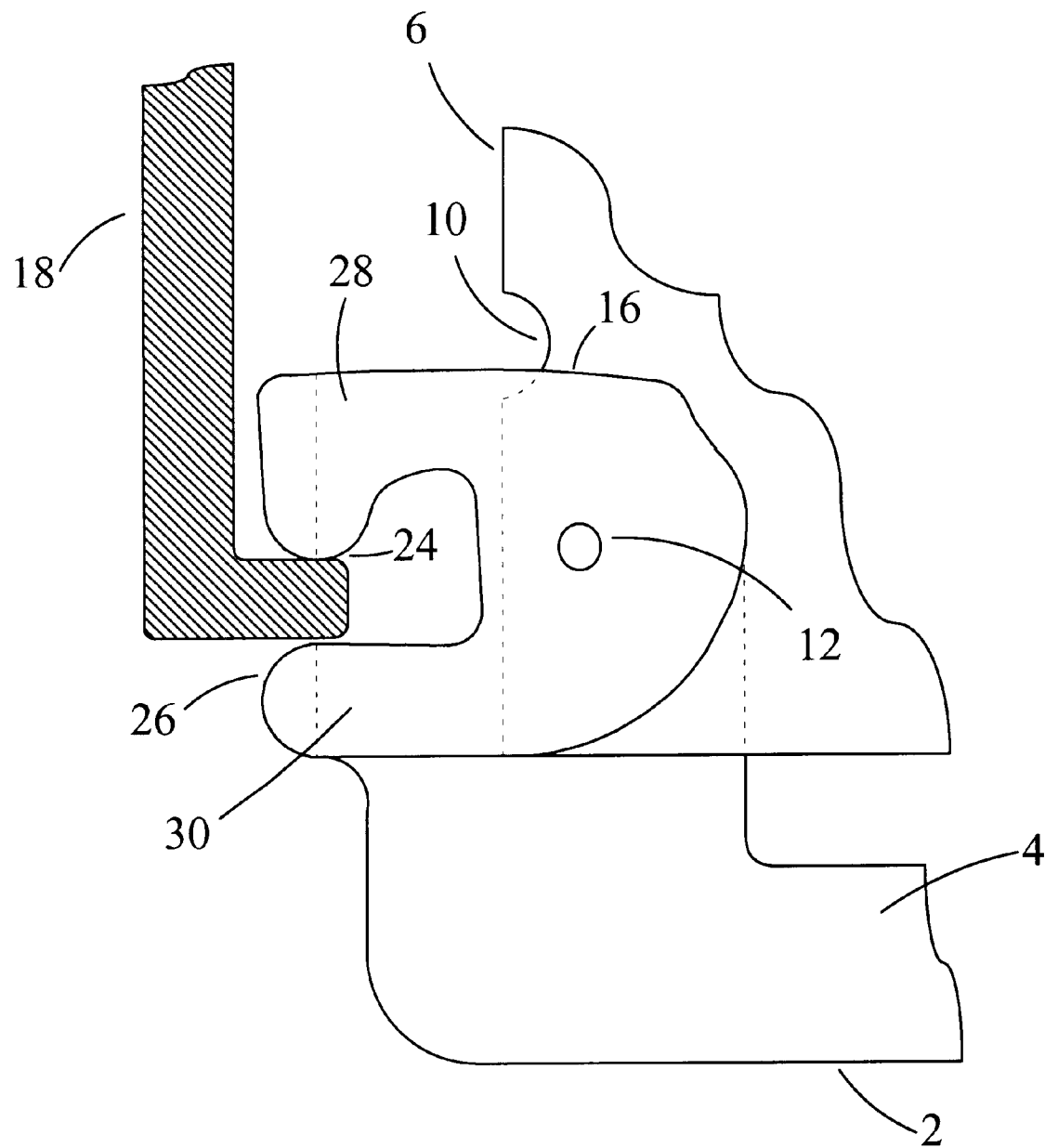
FIG. 2 is a partial plan view of one preferred embodiment of the insertion/extraction tool showing the printed circuit board fully inserted into the chassis.
Figure 3:
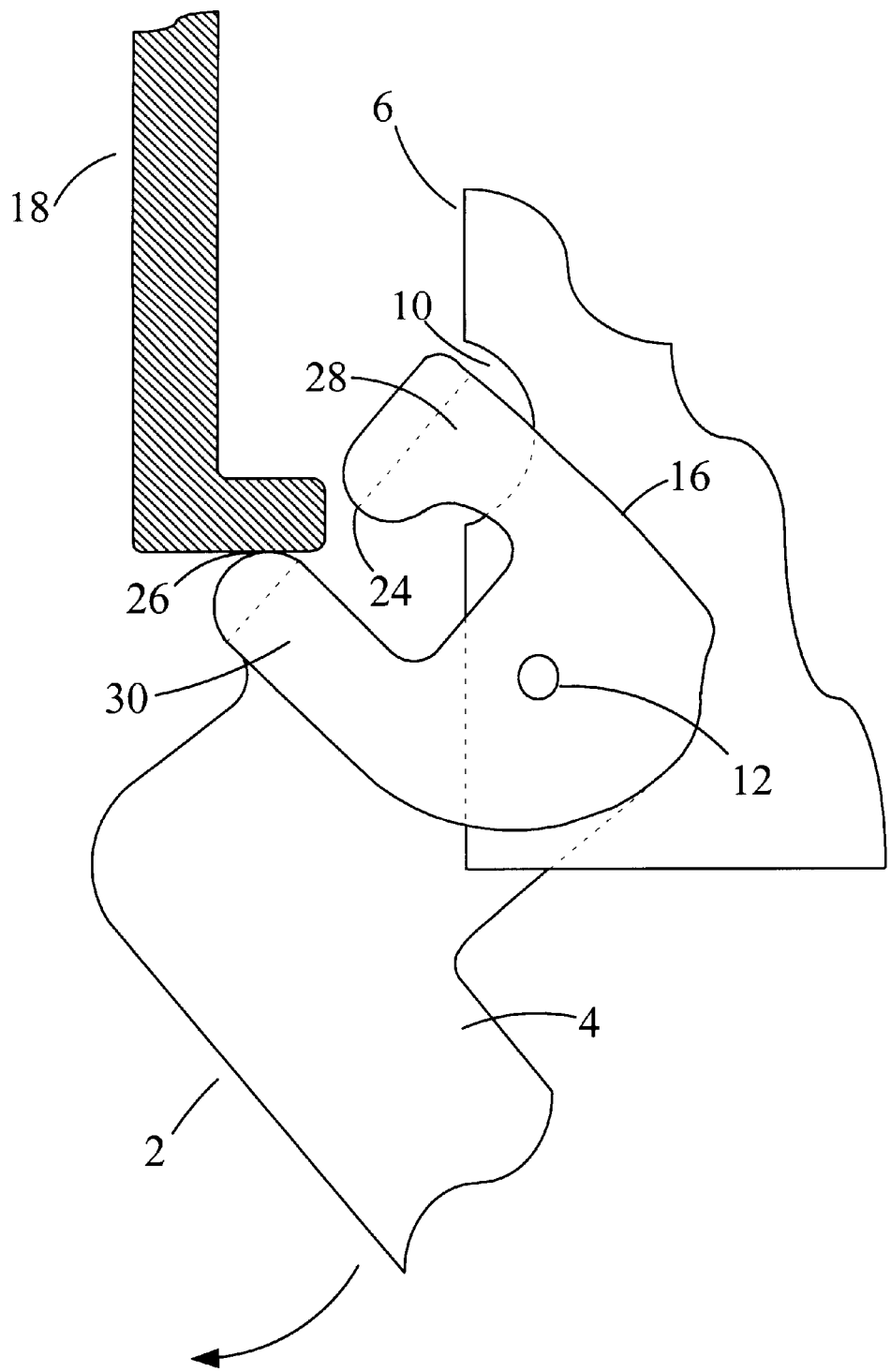
FIG. 3 is a partial plan view of one preferred embodiment of the insertion/extraction tool showing the printed circuit board in a partially ejected state.
Figure 4:
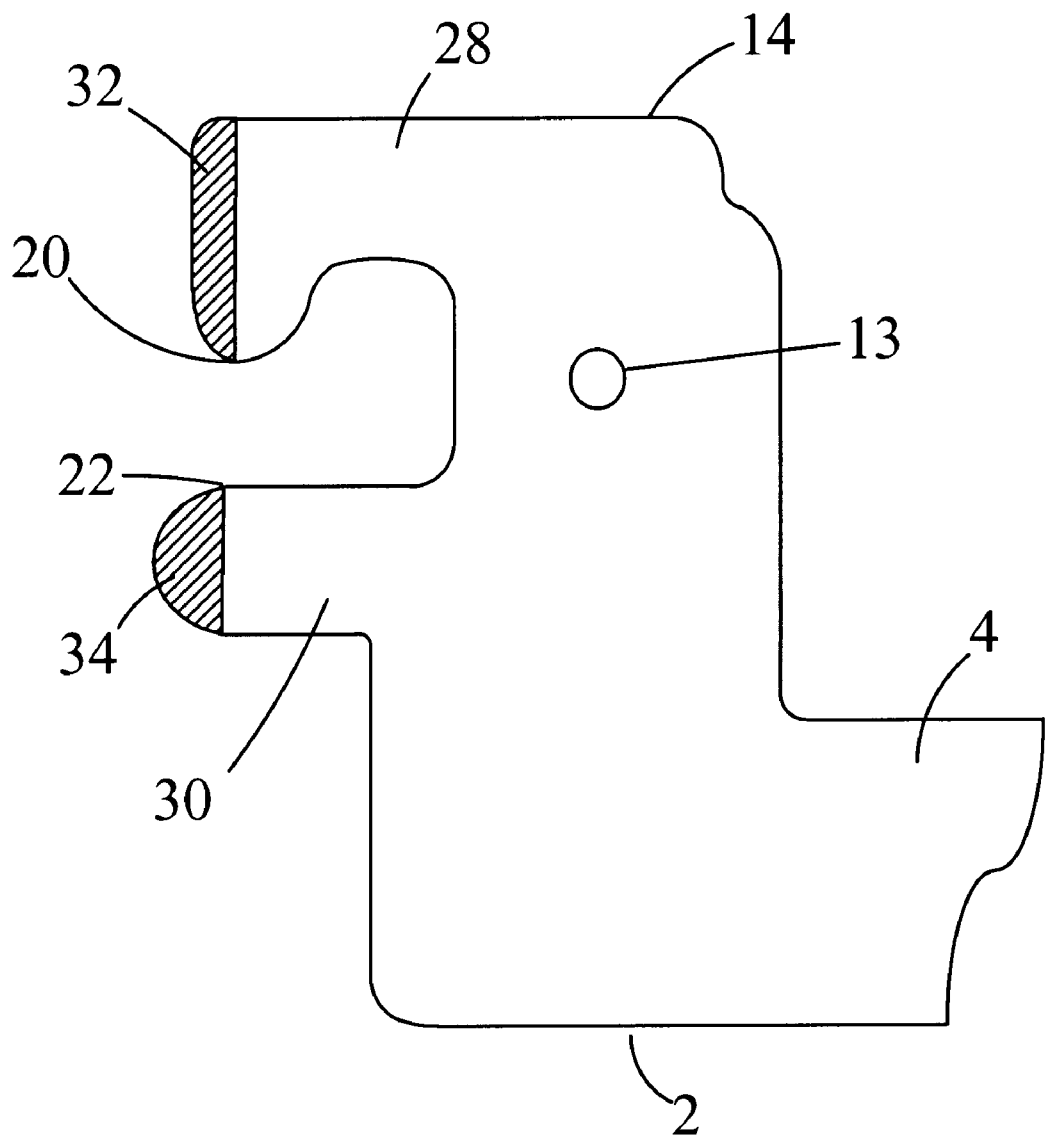
FIG. 4 is a partial sectional view of the insertion/extraction tool showing the lower section of the tool.
Figure 5:
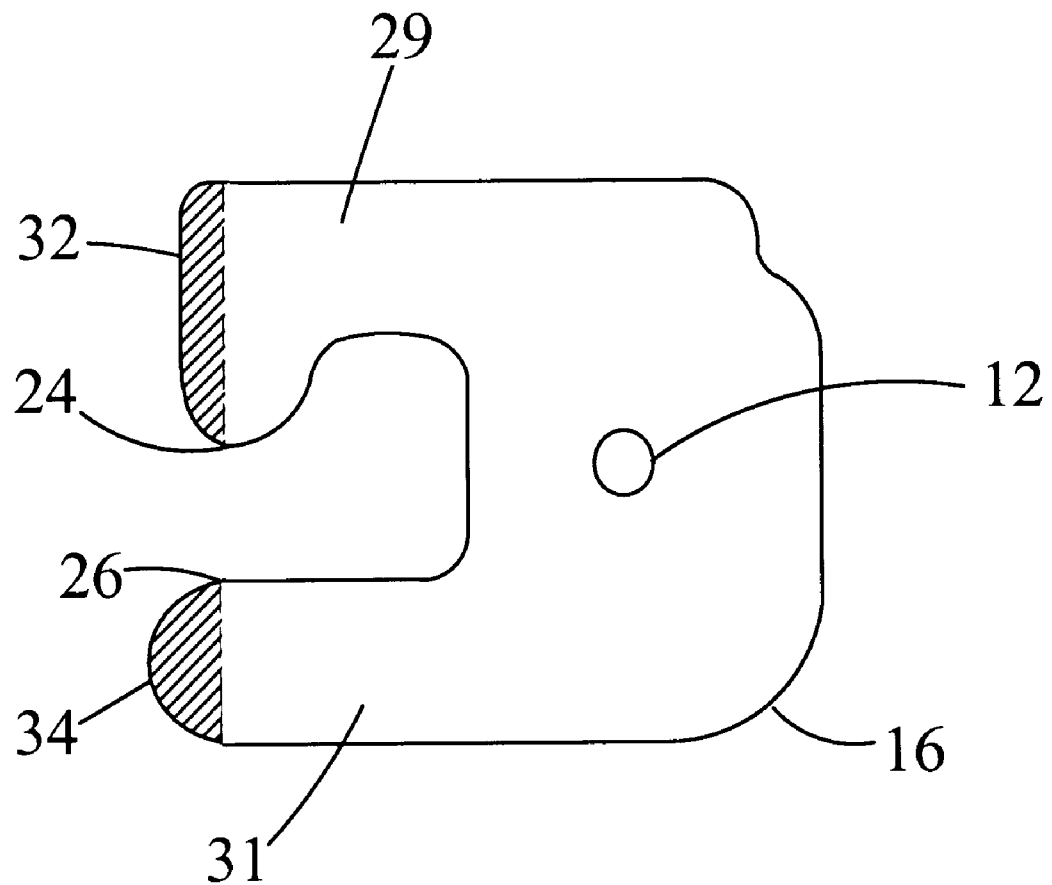
FIG. 5 is a partial sectional view of the insertion/extraction tool showing the upper section of the tool.
Figure 6:
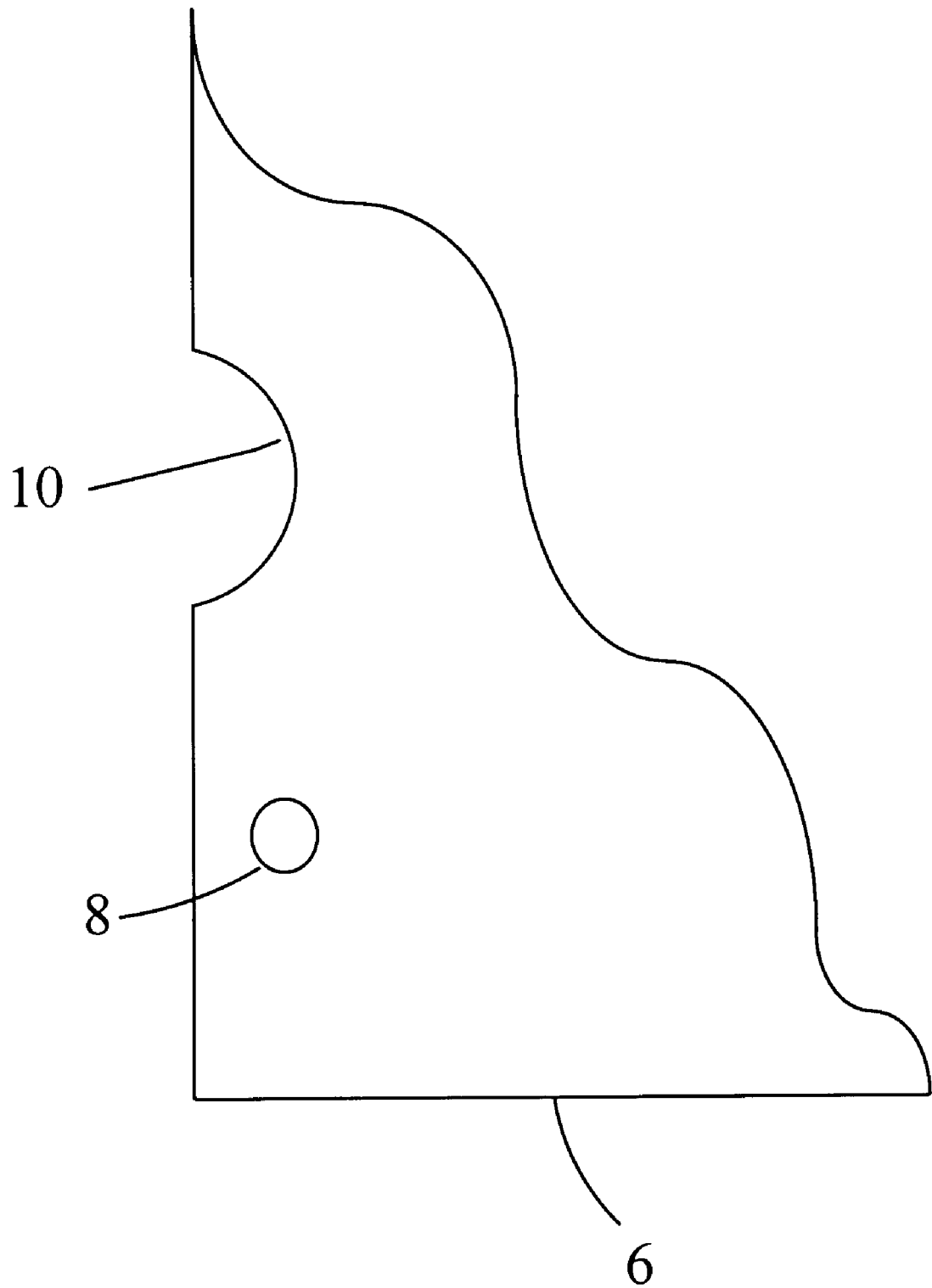
FIG. 6 is a partial plan view of the printed circuit board showing one preferred embodiment of the printed circuit board.

Insertion/extraction tool 2 operates as follows. FIG. 2 shows the printed circuit board 6 in the fully inserted position. Upper insertion surface 24 and lower insertion surface 20 of upper and lower toe portions, 28 and 29 respectively, engage the protruding portion of chassis 18. Upper extraction surface 26 and lower extraction surface 22 of upper and lower heel portions, 30 and 31, respectively, are disengaged from the protruding portion of chassis 18.

To extract printed circuit board 6 from the fully inserted position, handle 4 is rotated away from printed circuit board 6, pivoting insertion/extraction tool 2 clockwise about pivot means 17. This pivoting action causes upper and lower insertion surfaces, 24 and 20, respectively, to disengage from the protruding portion of chassis 18. This pivoting action also causes upper and lower extraction surfaces, 26 and 22, respectively, to engage the protruding portion of chassis 18. The force used to rotate handle 4 about pivot means 17 is transmitted to the chassis simultaneously through the upper and lower extraction surfaces, 26 and 22, respectively, impelling printed circuit board 6 outward from the fully inserted position. The simultaneous transmission of force both above and below the plane of printed circuit board 6 prevents printed circuit board 6 from bending out of its original plane.

To insert printed circuit board 6 to the fully inserted position, handle 4 is rotated towards printed circuit board 6, pivoting insertion/extraction tool 2 counter-clockwise about pivot means 17. This pivoting action causes upper and lower extraction surfaces, 26 and 22, respectively, to disengage from the protruding portion of chassis 18. This pivoting action also causes upper and lower insertion surfaces, 24 and 20, respectively, to engage the protruding portion of chassis 18. The force used to rotate handle 4 about pivot means 17 is transmitted to the chassis simultaneously through the upper and lower insertion surfaces, 24 and 20, respectively, impelling printed circuit board 6 inward toward the fully inserted position. The simultaneous transmission of force both above and below the plane of printed circuit board 6 prevents printed circuit board 6 from bending out of its original plane.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A system for inserting and extracting a printed circuit board from a chassis comprising:

a printed circuit board with a pair of opposing flat surfaces for attaching electrical components;

said printed circuit board containing a hole near a front corner and a notch on the edge adjacent the front corner, wherein said notch is further from the front corner than said hole; and an insertion/extraction tool comprising a handle portion pivotally secured to said printed circuit board overlying only one of the pair of opposing flat surfaces of said printed circuit board so that space is available on the other of the pair of opposing flat surfaces of said printed circuit board for electrical components;

a lower body portion including toe and heel sections integrally connected to the handle portion and contoured such that the toe section disengages the chassis during extraction of said printed circuit board and engages the chassis during insertion of said printed circuit board and the heel section engages the chassis during extraction of said printed circuit board and disengages the chassis during insertion of said printed circuit board;

an upper body portion including lower toe and heel sections connected to the lower body portion at the toe and heel sections such that a slot between the upper and lower body portions is created for receiving said printed circuit board, said upper body contoured such that the upper toe section disengages the chassis during extraction of said printed circuit board and engages the chassis during insertion of said printed circuit board and the upper heel section engages the chassis during extraction of said printed circuit board and disengages the chassis during insertion of said printed circuit board; and a pivot means connecting the upper body portion to the lower body portion, said pivot means being able to penetrate said printed circuit board so that, when the insertion/extraction tool is attached to said printed circuit board, said upper and lower body portions of the insertion/extraction tool overlie both sides of said printed circuit board and provide support on both sides of said printed circuit board during insertion and extraction.

2. A tool for inserting and extracting a notched printed circuit board (PCB) having first and second flat surfaces for attaching electrical components, into and out of a chassis, the front edge of the PCB facing away from the chassis, the tool comprising:

a first claw adjacent the first flat surface at a front corner of the PCB;

a second claw connected to said first claw such that a slot is formed for receiving the PCB between said claws so that the force associated with inserting and extracting the PCB is transmitted to both flat surfaces in order to minimize wear and tear on the PCB, wherein each claw includes a pair of protruding knobs contoured to engage the chassis along a side edge of the PCB; and a handle integral with said first claws said handle including a first bend such that when the PCB is installed said handle extends away from the PCB substantially parallel with the side edge of the PCB and then bends to extend substantially parallel to the front edge of the PCB thereby ensuring that the majority of the handle does not cover one of the flat surfaces of the PCB in order to increase the amount of area available for installing electrical components on the PCB.

3. The tool of claim 2, wherein the upper and lower claws are connected together at said protruding knobs such that when, said handle is moved away from the PCB the connected portion of said first and second claws passes into the notch in the PCB.

4. The tool of claim 2, wherein the handle further comprises a second bend away from the chassis along the front edge of the PCB thereby improving access to the tool.

5. A tool for insetting and extracting a printed circuit board (PCB) having a pair of opposing flat faces for attaching electrical components from a chassis comprising:

first and second claw portions adjacent opposite flat faces of the PCB and adapted to sandwich a front corner of the PCB therebetween, each of said claw portions including protruding knobs contoured to engage the chassis in which the PCB is to be inserted and extracted along the side edge of the PCB adjacent the front corner, said claw portions being connected at said protruding knobs thereby distributing the forces associated with inserting and extracting the PCB to both sides of the PCB so that wear and tear on the board is reduced; and a handle integrally connected to said first claw portion overlying only one face of the pair of opposing flat faces thereby allowing more room for installation of electrical components.

6. The tool of claim 5, wherein said claw portions include a hole to permit pivotal connection with the PCB.

7. The tool of claim 6, wherein the connection between said claw portions extends along the perimeter of said protruding knobs a sufficient distance such that upon rotation of the tool during extraction of the PCB the connected portions of the claws pass into a notched section on the side edge of the PCB.

\* \* \* \* \*